(12) United States Patent
Yu et al.

(10) Patent No.: US 8,583,426 B2
(45) Date of Patent: Nov. 12, 2013

(54) SPEECH ENHANCEMENT WITH VOICE CLARITY

(75) Inventors: Rongshan Yu, Singapore (SG); Charles Phillip Brown, Castro Valley, CA (US)

(73) Assignee: Dolby Laboratories Licensing Corporation, San Francisco, CA (US)

( * ) Notice: Subject to any disclaimer, the term of this patent is extended or adjusted under 35 U.S.C. 154(b) by 915 days.

(21) Appl. No.: 12/677,086

(22) PCT Filed: Sep. 10, 2008

(86) PCT No.: PCT/US2008/010590
§ 371 (c)(1),
(2), (4) Date: Mar. 8, 2010

(87) PCT Pub. No.: WO2009/035614
PCT Pub. Date: Mar. 19, 2009

(65) Prior Publication Data
US 2010/0211388 A1 Aug. 19, 2010

Related U.S. Application Data

(60) Provisional application No. 60/993,691, filed on Sep. 12, 2007.

(51) Int. Cl.
*G10L 19/14* (2006.01)
(52) U.S. Cl.
USPC ........... 704/225; 704/500; 704/200; 704/206; 704/226
(58) Field of Classification Search
USPC .......................... 704/500, 200, 206, 225, 226
See application file for complete search history.

(56) References Cited

U.S. PATENT DOCUMENTS

| 6,289,309 | B1 | 9/2001 | Devries |
| 6,366,880 | B1 | 4/2002 | Ashley |
| 6,415,253 | B1 * | 7/2002 | Johnson ........................ 704/210 |

(Continued)

FOREIGN PATENT DOCUMENTS

| EP | 1760696 | 3/2007 |
| JP | 6-208395 | 7/1994 |

(Continued)

OTHER PUBLICATIONS

Manohar, et al., "Speech Enhancement in Nonstationary Noise Environments Using Noise Properties", Speech Communication, Elsevier Science Publishers, Amsterdam, NL, vol. 48, No. 1, Jan. 1, 2006, pp. 96-109.

(Continued)

*Primary Examiner* — Qi Han

(57) ABSTRACT

A method for enhancing speech components of an audio signal composed of speech and noise components processes subbands of the audio signal, the processing including controlling the gain of the audio signal in ones of the subbands, wherein the gain in a subband is controlled at least by processes that convey either additive/subtractive differences in gain or multiplicative ratios of gain so as to reduce gain in a subband as the level of noise components increases with respect to the level of speech components in the subband and increase gain in a subband when speech components are present in subbands of the audio signal, the processes each responding to subbands of the audio signal and controlling gain independently of each other to provide a processed subband audio signal.

4 Claims, 4 Drawing Sheets

(56) References Cited

U.S. PATENT DOCUMENTS

| | | |
|---|---|---|
| 6,477,489 B1 | 11/2002 | Lockwood et al. |
| 6,732,073 B1 | 5/2004 | Kluender et al. |
| 6,760,435 B1 | 7/2004 | Etter et al. |
| 6,993,480 B1 | 1/2006 | Klayman |
| 7,191,122 B1 | 3/2007 | Gao et al. |
| 2003/0023430 A1 | 1/2003 | Wang et al. |
| 2004/0102967 A1 | 5/2004 | Furuta |
| 2005/0027520 A1* | 2/2005 | Mattila et al. ................ 704/228 |
| 2005/0240401 A1 | 10/2005 | Ebenezer |
| 2006/0206320 A1 | 9/2006 | Li |
| 2007/0094017 A1 | 4/2007 | Zinser, Jr. et al. |

FOREIGN PATENT DOCUMENTS

| | | |
|---|---|---|
| JP | 2002-169599 | 6/2002 |
| JP | 2002-519719 | 7/2002 |
| RU | 2163032 | 2/2001 |
| RU | 99114452 | 6/2001 |
| WO | 97/10586 A1 | 3/1997 |
| WO | 00/48171 | 8/2000 |
| WO | 03/015082 A1 | 2/2003 |
| WO | 2004/008801 A1 | 1/2004 |
| WO | 2004/013840 A1 | 2/2004 |

OTHER PUBLICATIONS

Boll, S.F., "Suppression of acoustic noise in speech using spectral subtraction," IEEE Trans. Acoust., Speech, Signal Processing, vol. 27, pp. 113-120, Apr. 1979.

Ephraim, Y., et al., "A brief survey of Speech Enhancement," The Electronic Handbook, CRC Press, Apr. 2005.

Ephraim, Y., et al., "Speech enhancement using a minimum mean square error short time spectral amplitude estimator," IEEE Trans. Acoust., Speech, Signal Processing, vol. 32, pp. 1109-1121, Dec. 1984.

Thomas, I., et al., "Preprocessing of Speech for Added Intelligibility in High Ambient Noise", 34th Audio Engineering Society Convention, Mar. 1968.

Villchur, E., "Signal Processing to Improve Speech Intelligibility for the Hearing Impaired", 99th Audio Engineering Society Convention, Sep. 1995.

Virag, V., "Single channel speech enhancement based on masking properties of the human auditory system," IEEE Tran. Speech and Audio Processing, vol. 7, pp. 126-137, Mar. 1999.

Martin, R., "Spectral subtraction based on minimum statistics," in Proc. EUSIPCO, 1994, pp. 1182-1185.

Wolfe, P. J., "Efficient alternatives to Ephraim and Malah suppression rule for audio signal enhancement," EURASIP Journal on Applied Signal Processing, vol. 2003, Issue 10, pp. 1043-1051, 2003.

B. Widrow, et al., Adaptive Signal Processing. Englewood Cliffs, NJ: Prentice Hall, 1985.

Intl Searching Authority, "Notification of Transmittal of the Intl Search Report and the Written Opinion of the Intl Searching Authority, or the Declaration", mailed Jun. 30, 2008 for Intl Application No. PCT/US2008/003453.

Terhardt, E., "Calculating Virtual Pitch," Hearing Research, pp. 155-182, 1, Oct. 16, 1978.

ISO/IEC JTC1/SC29/WG11, Information Technology—Coding of moving pictures and associated audio for digital storage media at up to about 1.5 Mbit/s—Part3: Audio, IS 11172-3, 1992.

Johnston, J., "Transform coding of audio signals using perceptual noise criteria," IEEE J. Select. Areas Commun., vol. 6, pp. 314-323, Feb. 1988.

Gustafsson, S. et al., "A novel psychoacoustically motivated audio enhancement algorithm preserving background noise characteristics," Proceedings of the 1998 IEEE International Conference on Acoustics, Speech, and Signal Processing, 1998. ICASSP '98.

Hu, Yi, et al., "Incorporating a psychoacoustic model in frequency domain speech enhancement," IEEE Signal Processing Letter, pp. 270-273, vol. 11, No. 2, Feb. 2004.

Lin, L., et al., "Speech denoising using perceptual modification of Wiener filtering," Electronics Letter, pp. 1486-1487, vol. 38, Nov. 2002.

Kondoz, A.M., "Digital Speech: Coding for Low Bit Rate Communication Systems," John Wiley & Sons, Ltd., 2nd Edition, 2004, Chichester, England, Chapter 10: Voice Activity Detection, pp. 357-377.

Schaub, A., "Spectral sharpening for speech enhancement noise reduction", Proc. ICASSP 1991, Toronto, Canada, May 1991, pp. 993-996.

Sondhi, M., "New methods of pitch extraction", Audio and Electroacoustics, IEEE Transactions, Jun. 1968, vol. 16, Issue 2, pp. 262-266.

Moore, B. et. al., "A Model for the Prediction of Thresholds, Loudness, and Partial Loudness", J. Audio Eng. Soc., vol. 45, No. 4, Apr. 1997.

Moore, B., et al., "Psychoacoustic consequences of compression in the peripheral auditory system", The Journal of the Acoustical Society of America—Dec. 2002—vol. 112, Issue 6, pp. 2962-2966.

Sallberg, B., et. al., "Analog Circuit Implementation for Speech Enhancement Purposes Signals"; Systems and Computers, 2004. Conference Record of the Thirty-Eighth Asilomar Conference.

Magotra, N., et al., "Real-time digital speech processing strategies for the hearing impaired"; Acoustics, Speech, and Signal Processing, 1997. ICASSP-97., 1997 pp. 1211-1214 vol. 2.

Walker, G., et al., "The effects of multichannel compression/expansion amplification on the intelligibility of nonsense syllables in noise"; The Journal of the Acoustical Society of America—Sep. 1984—vol. 76, Issue 3, pp. 746-757.

Vinton, M., et al., "Automated Speech/Other Discrimination for Loudness Monitoring," AES 118th Convention. 2005.

Scheirer, E., et. al., "Construction and evaluation of a robust multifeature speech/music discriminator", IEEE Transactions on Acoustics, Speech, and Signal Processing (ICASSP'97), 1997, pp. 1331-1334.

Hirsch, H.G., et al., "Noise Estimation Techniques for Robust Speech Recognition", Acoustics, Speech, and Signal Processing, May 9, 1995, Int'l Conf. on Detroit, vol. 1, pp. 153-156.

Martin, Rainer, Noise Power Spectral Density Estimation Based on Optimal Smoothing and Minimum Statistics, IEEE Transactions on Speech and Audio Processing, Jul. 1, 2001, Section II, vol. 9, p. 505.

Intl Searching Authority, "Notification of Transmittal of the Intl Search Report and the Written Opinion of the Intl Searching Authority, or the Declaration", mailed Jun. 25, 2008 for Intl Application No. PCT/US2008/003436.

Tsoukalas, D., et al., "Speech Enhancement Using Psychoacoustic Criteria", Intl Conf. on Acoustics, Speech, and Signal Processing, Apr. 27-30, 1993, vol. 2, pp. 359-362.

Intl Searching Authority, "Notification of Transmittal of the Intl Search Report and the Written Opinion of the Intl Searching Authority, or the Declaration", mailed Dec. 19, 2008 for Intl Application No. PCT/US2008/010590.

Ephraim, et al., "Speech enhancement using a minimum mean square error log-spectral amplitude estimator", IEEE Trans. Acoust., Speech, Signal Processing, vol. 33, pp. 443-445, Dec. 1985.

Cohen, I., et al., "Speech enhancement for non-stationary noise environments", Signal Processing, Elsevier Science Publishers B.V., Amsterdam, NL, vol. 81, No. 11, Nov. 1, 2001, pp. 2403-2418.

Westerlund, N., et al., "Speech enhancement for personal communication using an adaptive gain equalizer", Signal Processing, Elsevier Science Publishers B.V., Amsterdam, NL, vol. 85, No. 6, Jun. 1, 2005, pp. 1089-1101.

* cited by examiner

SPEECH ENHANCEMENT WITH VOICE CLARITY

TECHNICAL FIELD

The invention relates to audio signal processing. More particularly, it relates to a processor or processing method for speech enhancement and clarification of a noisy audio speech signal. The invention also relates to computer programs for practicing such methods or controlling such apparatus.

INCORPORATION BY REFERENCE

The following publications are hereby incorporated by reference, each in their entirety.
[1] S. F. Boll, "Suppression of acoustic noise in speech using spectral subtraction," *IEEE Trans. Acoust., Speech, Signal Processing*, vol. 27, pp. 113-120, April 1979.
[2] Y. Ephraim, H. Lev-Ari and W. J. J. Roberts, "A brief survey of Speech Enhancement," The Electronic Handbook, CRC Press, April 2005.
[3] Y. Ephraim and D. Malah, "Speech enhancement using a minimum mean square error short time spectral amplitude estimator," *IEEE Trans. Acoust., Speech, Signal Processing*, vol. 32, pp. 1109-1121, December 1984.
[4] Thomas, I. and Niederjohn, R., "Preprocessing of Speech for Added Intelligibility in High Ambient Noise", 34th Audio Engineering Society Convention, March 1968.
[5] Villchur, E., "Signal Processing to Improve Speech Intelligibility for the Hearing Impaired", 99th Audio Engineering Society Convention, September 1995.
[6] N. Virag, "Single channel speech enhancement based on masking properties of the human auditory system," *IEEE Tran. Speech and Audio Processing*, vol. 7, pp. 126-137, March 1999.
[7] R. Martin, "Spectral subtraction based on minimum statistics," in *Proc. EUSIPCO*, 1994, pp. 1182-1185.
[8] P. J. Wolfe and S. J. Godsill, "Efficient alternatives to Ephraim and Malah suppression rule for audio signal enhancement," *EURASIP Journal on Applied Signal Processing*, vol. 2003, Issue 10, Pages 1043-1051, 2003.
[9] B. Widrow and S. D. Stearns, *Adaptive Signal Processing*. Englewood Cliffs, N.J.: Prentice Hall, 1985.
[10] Y. Ephraim and D. Malah, "Speech enhancement using a minimum mean square error Log-spectral amplitude estimator," *IEEE Trans. Acoust., Speech, Signal Processing*, vol. 33, pp. 443-445, December 1985.
[11] E. Terhardt, "Calculating Virtual Pitch," *Hearing Research, pp.* 155-182, 1, 1979.
[12] ISO/IEC JTC1/SC29/WG11, *Information technology—Coding of moving pictures and associated audio for digital storage media at up to about 1.5 Mbit/s—Part3: Audio*, IS 11172-3, 1992
[13] J. Johnston, "Transform coding of audio signals using perceptual noise criteria," *IEEE J. Select. Areas Commun.*, vol. 6, pp. 314-323, February 1988.
[14] S. Gustafsson, P. Jax, P Vary, "A novel psychoacoustically motivated audio enhancement algorithm preserving background noise characteristics," *Proceedings of the 1998 IEEE International Conference on Acoustics, Speech, and Signal Processing*, 1998. ICASSP '98.
[15] Yi Hu, and P. C. Loizou, "Incorporating a psychoacoustic model in frequency domain speech enhancement," *IEEE Signal Processing Letter*, pp. 270-273, vol. 11, no. 2, February 2004.
[16] L. Lin, W. H. Holmes, and E. Ambikairajah, "Speech denoising using perceptual modification of Wiener filtering," *Electronics Letter*, pp 1486-1487, vol. 38, November, 2002.
[17] A. M. Kondoz, "Digital Speech: Coding for Low Bit Rate Communication Systems," John Wiley & Sons, Ltd., 2$^{nd}$ Edition, 2004, Chichester, England, Chapter 10: Voice Activity Detection, pp. 357-377.

DISCLOSURE OF THE INVENTION

According to a first aspect of the invention, speech components of an audio signal composed of speech and noise components are enhanced. An audio signal is changed from the time domain to a plurality of subbands in the frequency domain. The subbands of the audio signal are subsequently processed. The processing includes controlling the gain of the audio signal in ones of said subbands, wherein the gain in a subband is controlled at least by processes that convey either additive/subtractive differences in gain or multiplicative ratios of gain so as to (1) reduce gain in a subband as the level of noise components increases with respect to the level of speech components in the subband and (2) increase gain in a subband when speech components are present in subbands of the audio signal. The processes each respond to subbands of the audio signal and control gain independently of each other to provide a processed subband audio signal. The processed subband audio signal is changed from the frequency domain to the time domain to provide an audio signal in which speech components are enhanced.

The processes may include a speech enhancement process that responds to subbands of the audio signal to reduce gain in such subbands as the level of noise components increases with respect to the level of speech components in such subbands.

The processes may include a voice clarity process that responds to subbands of the audio signal to increase gain in ones of the subbands when speech components are present in subbands of the audio signal. The gain increase may be reduced in accordance with time smoothing upon a transition from the presence of speech components to speech components not being present.

The processes may also include a voice activity detection process that responds to subbands of the audio signal to determine when speech is present in noisy speech signal, the voice clarity process also responding to said voice activity detection process.

When the processes include a voice activity detection process that responds to subbands of the audio signal to determines when speech is present in noisy speech signal, each of said speech enhancement and voice clarity processes may also respond to the voice activity detection process.

According to another aspect of the invention, speech components of an audio signal composed of speech and noise components are enhanced. An audio signal is changed from the time domain to a plurality of subbands in the frequency domain. The subbands of the audio signal are subsequently processed. The processing includes increasing the gain in a subband when speech components are present in subbands of the audio signal to provide a processed subband audio signal. Subbands of the processed subband audio signal are processed, the processing including controlling the gain of the processed subband audio signal in ones of said subbands, wherein gain in a subband is reduced as the level of noise components increases with respect to the level of speech components in the subband to provide a further processed subband audio signal. The further processed subband audio signal is changed from the frequency domain to the time domain to provide an audio signal in which speech components are enhanced.

The processing may include a speech enhancement process that responds to processed subbands of the audio signal to reduce gain in such subbands as the level of noise components increases with respect to the level of speech components in such subbands.

The further processing may include a voice clarity process that responds to subbands of the audio signal to increase gain in ones of the subbands when speech components are present in subbands of the audio signal. The gain increase may be reduced in accordance with time smoothing upon a transition from the presence of speech components to speech components not being present.

The processing and/or the further processing may include a voice activity detection process that responds to subbands of the audio signal to determine when speech is present in noisy speech signal, the voice clarity process also responding to voice activity detection process.

The processing and/or the further processing may include a voice activity detection process that responds to subbands of the audio signal to determines when speech is present in noisy speech signal, each of said speech enhancement and voice clarity processes also responding to the voice activity detection process.

The processing may include a voice activity detection process that responds to subbands of the audio signal to determine when speech is present in noisy speech signal, each of said speech enhancement and voice clarity processes also responding to said voice activity detection process.

BEST MODE FOR CARRYING OUT THE INVENTION

Figure 1:
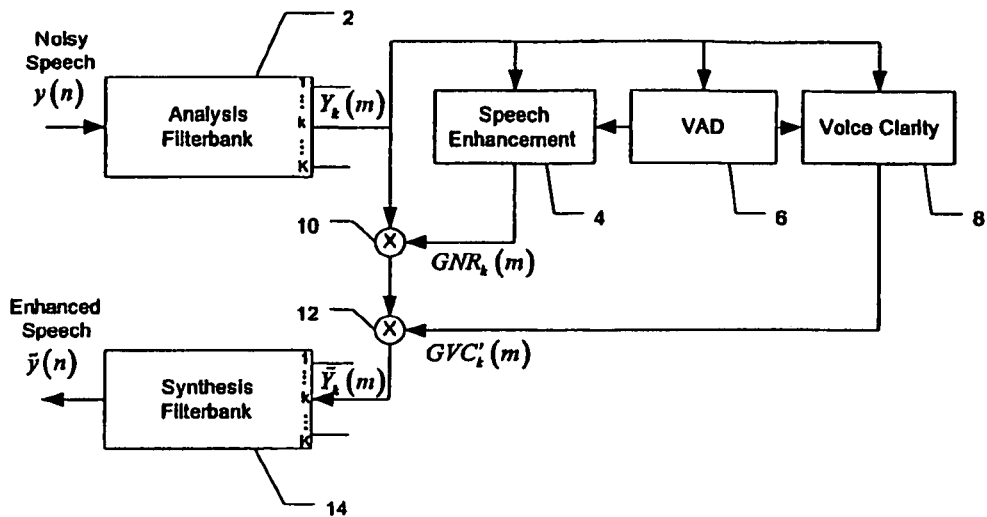
FIG. 1 is a functional block diagram showing an exemplary embodiment of the invention.

FIG. 1 shows an exemplary embodiment of aspects of the present invention according to a first topological functional arrangement. The input is generated by digitizing an analog speech signal that contains both clean speech as well as noise. This unaltered audio signal y(n) ("Noisy Speech"), where n=0, 1, . . . is the time index, is then sent to an analysis filterbank device or function ("Analysis Filterbank") 2, producing K multiple subband signals, $Y_k(m)$, k=1, . . . , K, m=0, 1, . . . , ∞, where k is the subband number, and m is the time index of each subband signal. Analysis Filterbank 2 changes the audio signal from the time domain to a plurality of subbands in the frequency domain.

The subband signals are applied to a noise-reducing device or function ("Speech Enhancement") 4, a voice-activity detector or detection function ("VAD") 6, and a voice-clarity improver or improvement function ("Voice Clarity") 8.

In response to the input subband signals and, optionally, in response to the VAD 6, Speech Enhancement 4 controls a gain scale factor $GNR_k(m)$ that scales the amplitude of the subband signals. Such an application of a gain scale factor to a subband signal is shown symbolically by a multiplier symbol 10. For clarity in presentation, the figures show the details of generating and applying a gain scale factor to only one of multiple subband signals (k).

The value of gain scale factor $GNR_k(m)$ is controlled by Speech Enhancement 4 so that subbands that are dominated by noise components (low signal-to-noise ("SNR")) are strongly suppressed while those dominated by speech (high SNR) are preserved. The value of $GNR_k(m)$ decreases (stronger suppression) in frequency regions (subbands) in which the signal-to-noise ratio (SNR) decreases and vice-versa.

In response to the input subband signals, VAD 6 determines when speech is present in noisy speech signal y(n), providing, for example, a VAD=1 output when speech is present and a VAD=0 output when speech is not present.

In response to the input subband signals and in response to the VAD 6, Voice Clarity 8 controls a gain scale factor $GVC'_k(m)$ that scales the amplitude of the subband signals. Such an application of a gain scale factor to a subband signal is shown symbolically by a multiplier symbol 12. The value of gain scale factor $GVC'_k(m)$ is controlled by Voice Clarity 8 so as to boost subbands important to the intelligibility of speech. Voice Clarity 8 is controlled by VAD 6 so that the gain factor $GVC'_k(m)$ provides boost in at least part of a voice frequency spectrum when speech is present. As explained further below, smoothing may be applied to minimize the introduction of audible artifacts when boost is turned off in the absence of speech.

Thus, enhanced subband speech signals $\tilde{Y}_k(m)$ are provided by applying gain scale factors $GNR_k(m)$ and $GVC'_k(m)$ to the unenhanced input subband signals $Y_k(m)$. This may be represented as:

$$\tilde{Y}_k(m) = GNR_k(m) \cdot GVC'_k(m) \cdot Y_k(m) \quad (1)$$

The dot symbol ("·") indicates multiplication. The gain scale factors $GNR_k(m)$ and $GVC'_k(m)$ may be applied to the unenhanced input subband signals $Y_k(m)$ in either order—Speech Enhancement 4 and Voice Clarity 8 are decoupled from each other and operate independently on the subband signals.

Figure 4:
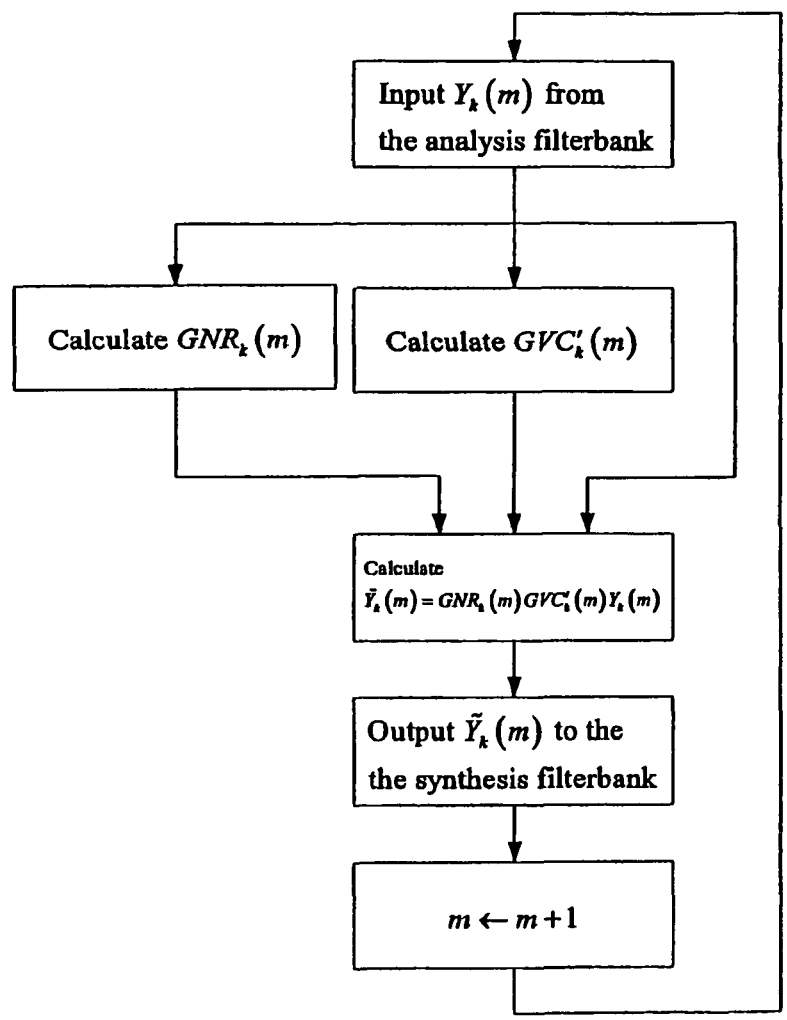
FIG. 4 is a flowchart relating to the exemplary embodiment of FIG. 1.
Figure 5:
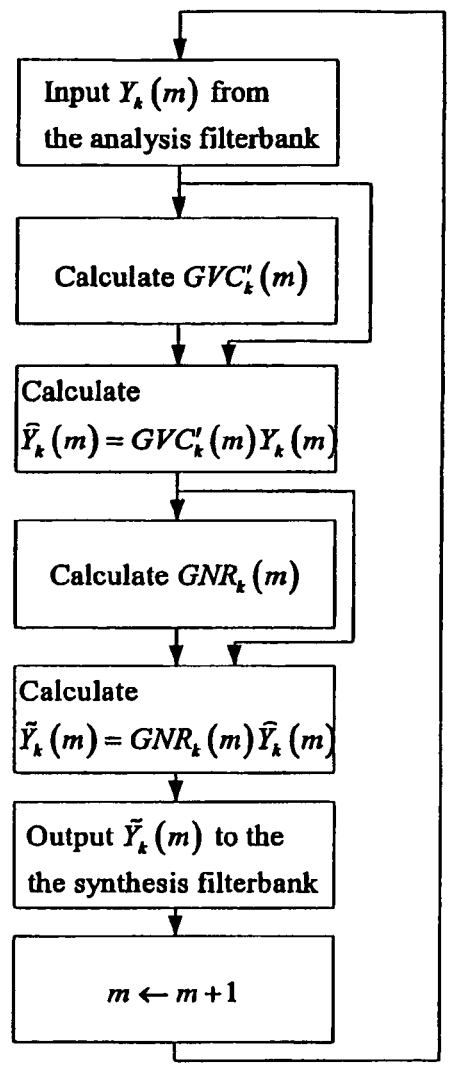
FIG. 5 is a flowchart relating to the exemplary embodiment of FIG. 2.

The processed subband signals $\tilde{Y}_k(m)$ may then be converted to the time domain by using a synthesis filterbank device or process ("Synthesis Filterbank") 14 that produces the enhanced speech signal $\tilde{y}(n)$. The synthesis filterbank changes the processed audio signal from the frequency domain to the time domain. The flowchart of FIG. 4 shows the process underlying the exemplary embodiment of FIG. 1. The final step indicates that the time index m is then advanced by one ("m←m+1") and the process of FIG. 4 is repeated.

Subband audio devices and processes may use either analog or digital techniques, or a hybrid of the two techniques. A subband filterbank can be implemented by a bank of digital bandpass filters or by a bank of analog bandpass filters. For digital bandpass filters, the input signal is sampled prior to filtering. The samples are passed through a digital filter bank and then downsampled to obtain subband signals. Each subband signal comprises samples which represent a portion of the input signal spectrum. For analog bandpass filters, the input signal is split into several analog signals each with a bandwidth corresponding to a filterbank bandpass filter bandwidth. The subband analog signals can be kept in analog form or converted into in digital form by sampling and quantizing.

Subband audio signals may also be derived using a transform coder that implements any one of several time-domain to frequency-domain transforms that functions as a bank of digital bandpass filters. The sampled input signal is segmented into "signal sample blocks" prior to filtering. One or more adjacent transform coefficients or bins can be grouped together to define "subbands" having effective bandwidths that are sums of individual transform coefficient bandwidths.

Although the invention may be implemented using analog or digital techniques or even a hybrid arrangement of such techniques, the invention is more conveniently implemented using digital techniques and the preferred embodiments disclosed herein are digital implementations. Thus, Analysis Filterbank 2 and Synthesis Filterbank 14 may be implemented by any suitable filterbank and inverse filterbank or transform and inverse transform, respectively.

Figure 2:
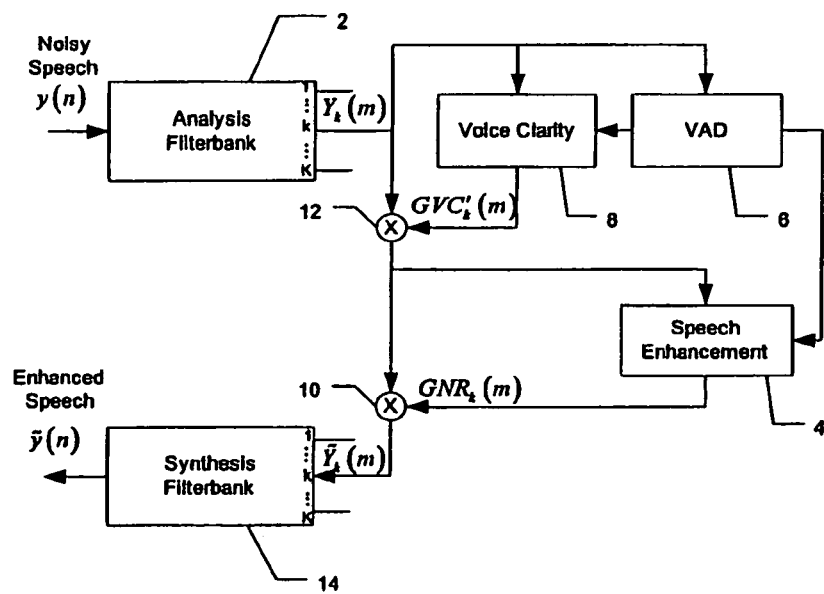
FIG. 2 is a functional block diagram showing an alternative exemplary embodiment of the invention.

FIG. 2 shows an exemplary embodiment of the present invention according to an alternative topological functional arrangement. Devices and functions corresponding to those in FIG. 2 employ the same reference numerals.

FIG. 2 differs from FIG. 1 in that Speech Enhancement 4 and Voice Clarity 8 are not decoupled from each other and do not operate independently on the subband signals. The subband signals are applied first to Voice Clarity 8 and VAD 6. The Voice Clarity gain scale factor $GVC'_k(m)$ is applied to multiplier 12. As in the FIG. 1 topology, Voice Clarity 8 is controlled by VAD 6 so that the gain factor $GVC'_k(m)$ selectively provides boost when speech is present. Unlike the FIG. 1 topology, Speech Enhancement 4 receives and operates upon the Voice-Clarity-processed subband signals $\tilde{Y}_k(m) = GVC'_k(m) \cdot \tilde{Y}_k(m)$ at the output of multiplier 12 rather than upon the unenhanced subband signals $Y_k(m)$. This may be represented as:

$$\tilde{Y}_k(m) = GNR_k(m) \cdot \tilde{Y}_k(m) \quad (2)$$

The dot symbol ("·") indicates multiplication.

Both the FIG. 1 and FIG. 2 topologies allow the use of noise suppressing and signal boosting speech enhancement without the signal boosting undoing the noise suppression.

Although the gain scale factors are shown controlling subband amplitudes multiplicatively in FIGS. 1 and 2, it will be apparent to those of ordinary skill in the art that equivalent additive/subtractive arrangements may be employed.

Speech Enhancement 4

Various spectral enhancement devices and functions may be useful in implementing Speech Enhancement 4 in practical embodiments of the present invention. Among such spectral enhancement devices and functions are those that employ VAD-based noise-level estimators and those that employ statistically-based noise-level estimators. Such useful spectral enhancement devices and functions may include those described in references 1, 2, 3, 6 and 7, listed above and in the following four United States Provisional patent applications:
  (1) "Noise Variance Estimator for Speech Enhancement," of Rongshan Yu, Ser. No. 60/918,964, filed Mar. 19, 2007;
  (2) "Speech Enhancement Employing a Perceptual Model," of Rongshan Yu, Ser. No. 60/918,986, filed Mar. 19, 2007; and
  (3) "Speech Enhancement with Noise Level Estimation Adjustment," of Rongshan Yu, Ser. No. 60/993,548, filed Sep. 12, 2007.
  (4) "Speech Enhancement," of C. Philip Brown, Ser. No. 60/993,601, filed Sep. 12, 2007.

The speech enhancement gain factor $GNR_k(m)$ may be referred to as a "suppression gain" because its purpose is to suppress noise. One way of controlling suppression gain is known as "spectral subtraction" (references [1], [2] and [7]), in which the suppression gain $GNR_k(m)$ applied to the subband signal $Y_k(m)$ may be expressed as:

$$GNR_k(m) = \sqrt{1 - a \frac{\lambda_k(m)}{|Y_k(m)|^2}}, \quad (3)$$

where $|Y_k(m)|$ is the amplitude of subband signal $Y_k(m)$, $\lambda_k(m)$ is the noise energy in subband k, and $\alpha > 1$ is an "over subtraction" factor chosen to assure that a sufficient suppression gain is applied. "Over subtraction" is explained further in reference [7] at page 2 and in reference 6 at page 127.

In order to determine appropriate amounts of suppression gains, it is important to have an accurate estimation of the noise energy for subbands in the incoming signal. However, it is not a trivial task to do so when the noise signal is mixed together with the speech signal in the incoming signal. One way to solve this problem is to use a voice-activity-detection-based noise level estimator that uses a standalone voice activity detector (VAD) to determine whether a speech signal is present in the incoming signal or not. The noise energy is updated during the period when speech is not present (VAD=0). See, for example, reference [3]. In such a noise estimator, the noise energy estimation $\lambda_k(m)$ for time in may be given by:

$$\lambda_k(m) = \begin{cases} \beta \lambda_k(m-1) + (1-\beta)|Y_k(m)|^2 & VAD = 0; \\ \lambda_k(m-1) & VAD = 1. \end{cases} \quad (4)$$

The initial value of the noise energy estimation $\lambda_k(-1)$ can be set to zero, or set to the noise energy measured during the initialization stage of the process. The parameter $\beta$ is a smoothing factor having a value $0 \ll \beta < 1$. When speech is not present (VAD=0), the estimation of the noise energy may be obtained by performing a first order time smoother operation (sometimes called a "leaky integrator") on the power of the input signal $Y_k(m)$. The smoothing factor $\beta$ may be a positive value that is slightly less than one. Usually, for a stationary input signal a $\beta$ value closer to one will lead to a more accurate estimation. On the other hand, the value $\beta$ should not be too close to one to avoid losing the ability to track changes in the noise energy when the input becomes not stationary. In practical embodiments of the present invention, a value of $\beta=0.98$ has been found to provide satisfactory results. However, this value is not critical. It is also possible to estimate the noise energy by using a more complex time smoother that may be non-linear or linear (such as a multipole lowpass filter.)

The time period of each m, like as in any digital system, is decided by the sampling rate of the subband. So it may vary depends depending on the sampling rate of the input signal, and the filterbank used. In a practical implementation, the time period for each m is 1(s)/8000*32=4 ms with an 8 kHz speech signal and a filterbank with a downsampling factor of 32).

Voice Activity Detector (VAD) 6

Many voice activity detectors and detector functions are known. Suitable such devices or functions are described in Chapter 10 of reference [17] and in the bibliography thereof. The use of any particular voice activity detector is not critical to the invention.

Voice Clarity 8

Various voice clarity devices and functions may be useful in implementing Voice Clarity 8 in practical embodiments of the present invention.

Speech consists of a number of different cues that are used in perception. As air is expelled from the lungs, the vocal cords vibrate. As the air escapes, the larynx, mouth and nose modify the acoustic energy to produce a variety of sounds. "Vowels" have regions of strong harmonic energy, and are generated with unimpeded airflow. "Consonants" including "Approximants", "fricatives" and "stops" are generated by increasingly restrictive airflow, and have higher frequency content (but weaker energy) than do vowels. It has long been known that the consonants of the speech contribute greatly to intelligibility; and the vowels, although they usually have stronger energies, contribute relatively little. Based on this fact, voice clarity devices and functions usually use an equalizer, highpass shelving filter, or highpass filter such as in reference [4] to boost the frequency ranges where the weak consonants reside, usually the higher frequencies, of the speech in order to improve intelligibility. Similar technologies have also been used in hearing-aid applications for hearing-impaired listeners who have difficulty to perceive high frequencies components of the speech signal as in reference [5]. A spectral flattening approach such as that described below and in a United States Provisional patent application ";" of C. Phillip Brown, Ser. No. 60/993,601, filed Sep. 12, 2007. The voice clarity gain scale factors increase the levels of the relative weak components in the speech signal so that they are better perceived by human listeners. The choice of any particular voice clarity device or function is not critical to the present invention.

The voice clarity gain $GVC'_k(m)$ may be produced by a voice clarity process or device as follows:

$$GVC'_k(m) = \begin{cases} GVC_k(m) & VAD = 1 \\ \kappa GVC'_k(m-1) + (1-\kappa) & VAD = 0. \end{cases} \quad (5)$$

$GVC_k(m)$ is the voice clarity gain when the input is speech, and $0<\kappa<1$ is a smoothing factor. The value of $\kappa$ controls the speed of the voice clarity gain, reducing to one (no boost) during a pause in speech. Its best value can be set through experiments. In a practical embodiment of the present invention, a value of $\kappa=0.9$ has been found to provide good results. However, this value is not critical. Thus, the voice clarity process increases gain when speech components are present, the gain reducing in accordance with time smoothing upon a transition from the presence of speech components to speech components not being present.

The purpose of having the gain factors $GVC_k(m)$ is to boost the levels of selected frequency regions with respect to others so that the intelligibility of the speech signal is improved. In one useful implementation of this invention, $GVC_k(m)$ may be calculated as the lesser of $G_{max}$ or a scaled ratio of the energy in the subband having the highest energy to the energy in each of the other subbands:

$$GVC_k(m) = \min\left[\left(\frac{E_{max}(m)}{E_k(m)}\right)^{\gamma/2}, G_{max}\right], \quad (6)$$

where $$E_k(m) = \alpha E_k(m) + (1-\alpha)|Y_k(m)|^2, \quad (7)$$

$$E_{max}(m) = \max_{k=1,\ldots,K}(E_k(m)), \quad (8)$$

$0<\gamma<1$ is a pre-selected scaling factor, $0<<\alpha<1$ is a smoothing factor, and $G_{max}$ is a pre-selected maximum gain. The initial value $E_k(-1)$ can be set to zero. The value of $\gamma$ decides the ratio of the energy of the weak components to that of the strong components in the speech after the processing. For example, if $\gamma=0.5$, however much the subband energy $E_k(m)$ is below $E_{max}(m)$ it is boosted by half their difference—in effect acting as a 2-1 compressor for the subband. The value of $G_{max}$ controls the maximum allowable amount of boost of the voice clarity algorithm. The values of $\gamma$ and $G_{max}$ control the aggressiveness of the voice clarity process as they jointly decide the amount of the boosting of the weak components in the speech. Their optimum values vary according to the characteristics of the signal under processing, the acoustic environment of the target application, and the user preferences. Instead of being boosted toward a fixed magnitude, the boosting may, alternatively, be toward a frequency-dependent magnitude, such as one defined by a highpass shelving response.

Figure 3:
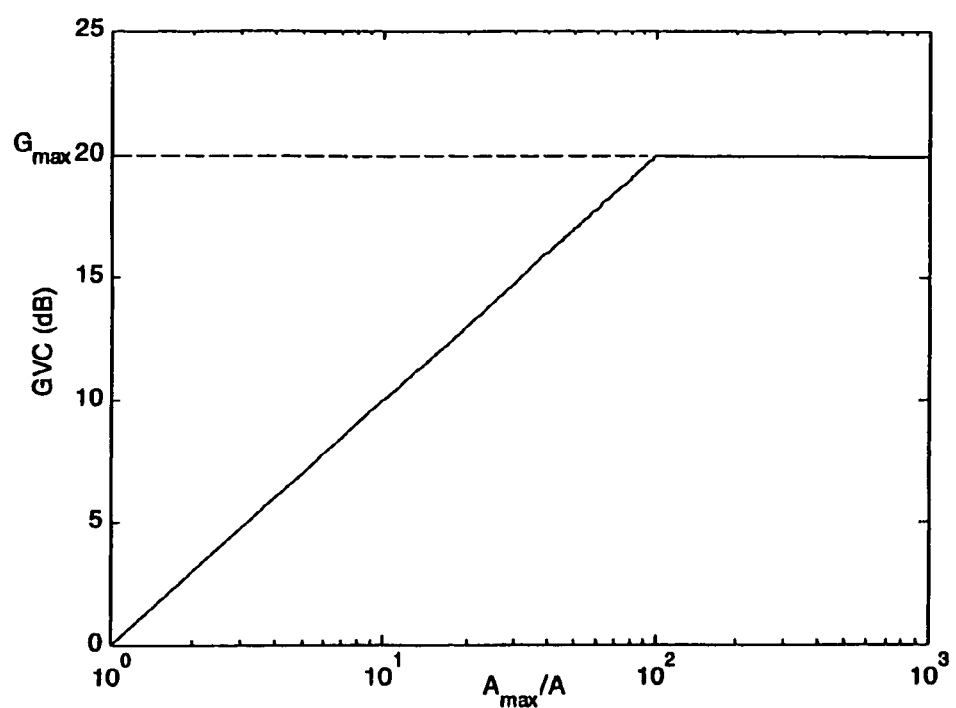
FIG. 3 is a plot showing the value of $GVC_k(m)$ as a function of $E_k(m)/E_{max}(m)$.

As an example, FIG. 3 shows the value of $GVC_k(m)$ as a function of $E_k(m)/E_{max}(m)$. In this example, $\gamma=1$ and $G_{max}=20$ dB. As with respect to smoothing factors mentioned above, the smoothing factor $\alpha$ may be implemented by a first order time smoother such as a single pole lowpass filter (sometimes called a "leaky integrator") or a more complex time smoother that may be non-linear or linear (such as a multipole lowpass filter.

Implementation

The invention may be implemented in hardware or software, or a combination of both (e.g., programmable logic arrays). Unless otherwise specified, the processes included as part of the invention are not inherently related to any particular computer or other apparatus. In particular, various general-purpose machines may be used with programs written in accordance with the teachings herein, or it may be more convenient to construct more specialized apparatus (e.g., integrated circuits) to perform the required method steps. Thus, the invention may be implemented in one or more computer programs executing on one or more programmable computer systems each comprising at least one processor, at least one data storage system (including volatile and non-volatile memory and/or storage elements), at least one input device or port, and at least one output device or port. Program code is applied to input data to perform the functions described herein and generate output information. The output information is applied to one or more output devices, in known fashion.

Each such program may be implemented in any desired computer language (including machine, assembly, or high level procedural, logical, or object oriented programming languages) to communicate with a computer system. In any case, the language may be a compiled or interpreted language.

It will be appreciated that various devices, functions and processes shown and described in various examples herein may be shown combined or separated in ways other than as shown in the figures herein. For example, when implemented by computer software instruction sequences, functions may be implemented by multithreaded software instruction sequences running in suitable digital signal processing hardware, in which case the various devices and functions in the examples shown in the figures may correspond to portions of the software instructions.

Each such computer program is preferably stored on or downloaded to a storage media or device (e.g., solid state memory or media, or magnetic or optical media) readable by a general or special purpose programmable computer, for configuring and operating the computer when the storage media or device is read by the computer system to perform the procedures described herein. The inventive system may also be considered to be implemented as a computer-readable storage medium, configured with a computer program, where the storage medium so configured causes a computer system to operate in a specific and predefined manner to perform the functions described herein.

A number of embodiments of the invention have been described. Nevertheless, it will be understood that various modifications may be made without departing from the spirit and scope of the invention. For example, some of the steps described herein may be order independent, and thus can be performed in an order different from that described.

The invention claimed is:

1. A method for enhancing speech components of an audio signal composed of speech and noise components, comprising:

changing the audio signal from a time domain representation to a plurality of subbands in a frequency domain representation producing K multiple subband signals, $Y_k(m)$, k=1, ..., K, m=0, 1, ..., ∞, where k is the subband number, and m is a time index of each subband signal, processing subbands of the audio signal, wherein a subband has a gain, said processing including controlling the gain of the audio signal in ones of said subbands, wherein the gain in a subband is controlled by an additive/subtractive or multiplicative combination of a) reducing the gain of the audio signal in a subband as an estimate of the level of noise components in the subband increases, wherein the estimate of the level of noise components in the subband is determined when speech is not present, and b) increasing the gain of the audio signal in one or more subbands important to the intelligibility of speech in accordance with a voice clarity process when speech components are present in the audio signal, the gain increase being reduced in accordance with time smoothing upon a transition from the presence of speech components to speech components not being present, the processes a) and b) each being performed according to a set of parameters continuously updated for each time index m, said parameters being dependent only on their respective prior value at time index (m−1), characteristics of the subband at time index m, and a set of predetermined constants, changing the processed subband audio signal from the frequency domain to the time domain to provide an audio signal in which speech components are enhanced, and wherein the process is performed by a special purpose computer performing the steps of the process or by a general purpose computer programmed to perform the steps of the process.

2. A non-transitory computer-readable storage medium encoded with a computer program for causing a computer to perform the method of claim 1.

3. A method for enhancing speech components of an audio signal composed of speech and noise components, comprising:

changing the audio signal from a time domain representation to a plurality of subbands in a frequency domain representation, producing K multiple subband signals, $Y_k(m)$, k=1, ..., K, m=0, 1, ..., ∞, where k is the subband number, and m is a time index of each subband signal, processing subbands of the audio signal, wherein a subband has a gain, said processing including increasing the gain of the audio signal in one or more subbands important to the intelligibility of speech in accordance with a voice clarity process when speech components are present in the audio signal to provide a processed subband audio signal, wherein a subband of a processed subband audio signal has a gain, the gain increase being reduced in accordance with time smoothing upon a transition from the presence of speech components to speech components not being present, processing subbands of the processed subband audio signal, said processing subbands of the processed subband audio signal including controlling the gain of the processed subband audio signal in ones of said subbands, wherein gain in a subband is reduced as an estimate of the level of noise components increases with respect to the level of speech components in the subband to provide a further processed subband audio signal, wherein the estimate of the level of noise components in the subband is determined when speech is not present, wherein both the first-recited and second-recited processing is performed according to a set of parameters continuously updated for each time index m, said parameters being dependent only on their respective prior value at time index (m−1), characteristics of the subband at time index m, and a set of predetermined constants, and changing the further processed audio signal from the frequency domain to the time domain to provide an audio signal in which speech components are enhanced, and wherein the process is performed by a special purpose computer performing the steps of the process or by a general purpose computer programmed to perform the steps of the process.

4. A non-transitory computer-readable storage medium encoded with a computer program for causing a computer to perform the method of claim 3.

* * * * *